United States Patent
Zeng et al.

(10) Patent No.: US 10,662,523 B2
(45) Date of Patent: May 26, 2020

(54) EXTREME DURABILITY COMPOSITE DIAMOND FILM

(71) Applicant: Advanced Diamond Technologies, Inc., Romeoville, IL (US)

(72) Inventors: Hongjun Zeng, Naperville, IL (US); John Arthur Carlisle, Plainfield, IL (US); Ian Wakefield Wylie, Coquitlam (CA)

(73) Assignee: JOHN CRANE INC., Chicago, IL (US)

( * ) Notice: Subject to any disclaimer, the term of this patent is extended or adjusted under 35 U.S.C. 154(b) by 170 days.

(21) Appl. No.: 15/167,363

(22) Filed: May 27, 2016

(65) Prior Publication Data

US 2016/0348236 A1    Dec. 1, 2016

Related U.S. Application Data

(60) Provisional application No. 62/166,738, filed on May 27, 2015.

(51) Int. Cl.
*C04B 35/52* (2006.01)
*C23C 16/27* (2006.01)
(Continued)

(52) U.S. Cl.
CPC ............ *C23C 16/27* (2013.01); *B32B 18/00* (2013.01); *C04B 35/52* (2013.01); *C04B 35/528* (2013.01);
(Continued)

(58) Field of Classification Search
CPC .......... C04B 2237/58; C04B 2237/588; C04B 2235/78; C04B 2235/785; C23C 16/27
See application file for complete search history.

(56) References Cited

U.S. PATENT DOCUMENTS 4,766,040 A    8/1988    Hillert et al.
5,955,155 A    9/1999    Yamamoto et al.
(Continued)

FOREIGN PATENT DOCUMENTS

WO    WO 2012/142435 A2    10/2012
WO    WO 2013/078004 A1    5/2013

OTHER PUBLICATIONS

J.V. Macpherson, "A practical guide to using boron doped diamond in electrochemical research," Phys. Chem. Chem. Phys., 17, pp. 2935-2949 (2014).
(Continued)

*Primary Examiner* — Laura A Auer
(74) *Attorney, Agent, or Firm* — Cantor Colburn LLP

(57) ABSTRACT

A novel composite diamond film comprising of a relatively thick layer of UNCD (Ultrananocrystalline Diamond) with a Young's modulus of less than 900 GPa and a relatively thin MCD (microcrystalline diamond) outermost layer with a Young's modulus of greater than 900 GPa, has been shown to exhibit superior delamination resistance under extreme shear stress. It is hypothesized that this improvement is due to a combination of stress relief by the composite film with a slightly "softer" UNCD layer, a disruption of the fracture mechanism through the composite layer(s), and the near ideal chemical and thermal expansion coefficient match between the two diamond layers. The combination of a thick but "softer" underlying UNCD layer with a thin but harder overlying MCD layer provides an excellent compromise between the low deposition cost and smoothness of UNCD with the extreme hardness and unparalleled chemical, electrochemical and immunological inertness of even a thin layer of MCD. The MCD layer's roughness is minimized and its adhesion maximized by the use of a thin layer of MCD and its deposition on the smooth surface of the chemically nearly identical underlying UNCD layer. The
(Continued)

composite film can be applied to any application currently utilizing a diamond or a similar hard film, including cutting tools, abrasive surfaces, electrochemistry, biomedical applications such as human implants or thermally conductive films and the like, requiring superior durability, chemical resistance and/or immunological inertness.

33 Claims, 7 Drawing Sheets

(51) Int. Cl.
    *C23C 16/50*     (2006.01)
    *C04B 35/622*     (2006.01)
    *C04B 35/528*     (2006.01)
    *B32B 18/00*     (2006.01)

(52) U.S. Cl.
    CPC ........ *C04B 35/62222* (2013.01); *C23C 16/50* (2013.01); *C04B 2235/427* (2013.01); *C04B 2235/78* (2013.01); *C04B 2235/781* (2013.01); *C04B 2235/785* (2013.01); *C04B 2235/96* (2013.01); *C04B 2237/363* (2013.01); *C04B 2237/58* (2013.01); *C04B 2237/588* (2013.01); *C04B 2237/70* (2013.01)

(56) References Cited

U.S. PATENT DOCUMENTS

| | | | |
|---|---|---|---|
| 6,447,843 B1* | 9/2002 | Olson | C23C 16/279 427/249.8 |
| 6,592,839 B2 | 7/2003 | Gruen et al. | |
| 6,620,210 B2 | 9/2003 | Murphy et al. | |
| 7,384,693 B2 | 6/2008 | Ravi | |
| 7,556,982 B2 | 7/2009 | Carlisle et al. | |
| 7,563,346 B2 | 7/2009 | Chen | |
| 8,101,273 B2 | 1/2012 | Jacquet et al. | |
| 8,734,626 B2 | 5/2014 | Arihara et al. | |
| 8,980,079 B2 | 3/2015 | Yost, III et al. | |
| 2008/0160271 A1 | 7/2008 | Rueffer et al. | |
| 2009/0017258 A1* | 1/2009 | Carlisle | C23C 16/271 428/143 |
| 2010/0129615 A1* | 5/2010 | Chizik | C23C 14/025 428/189 |
| 2011/0247929 A1 | 10/2011 | Nagai et al. | |
| 2012/0168302 A1 | 7/2012 | Kato et al. | |
| 2013/0213823 A1 | 8/2013 | Arumugam et al. | |
| 2013/0330529 A1* | 12/2013 | Sato | C23C 16/271 428/216 |
| 2014/0174942 A1 | 6/2014 | Wylie et al. | |
| 2015/0250421 A1* | 9/2015 | Arumugam | A61B 5/04001 600/345 |

OTHER PUBLICATIONS

M. Panizza et al., "Electrochemical Polishing of Boron-Doped Diamond in Organic Media," Electrochemical and Solid-State Letters, 6(12), pp. D17-D19 (2003).
L.M. da Silva et al, "Boron Doped Ultrananocrystalline Diamond Films on Porous Silicon: Morphological, Structural and Electrochemical Characterizations," Materials Research, 18(6), pp. 1407-1413.
P. J. Pauzauskie et al., "Synthesis and characterization of a nonocrystalline diamond aerogel," PNAS, 108(21), pp. 8550-8553 (May 24, 2011).
V. Baranauskas et al., "Method of porous diamond deposition on porous silicon," Applied Surface Science, 185, pp. 108-113 (2001).
T. Kondo et al., "Micrometer-sized mesoporous diamond spherical particles," Diamond & Related Materials, 43, pp. 72-79 (2014.
F. Gao et al., "Highly porous diamond foam as a thin-film microsupercapacitor material," Carbon, 80, pp. 833-843 (2014).
C. Hébert et al., "Porous diamond with high electrochemical performance," Carbon, 90, pp. 102-109 (2015).
H. Zanin et al., "Porous Boron-Doped Diamond/Carbon Nanotube Electrodes," ACS Applied Materials & Interfaces, 6, pp. 990-995 (2014).
U.S. Appl. No. 15/801,759, filed Nov. 2, 2017, Zeng, Hongjun.
U.S. Appl. No. 15/179,337, filed Jun. 10, 2016, Zeng, Hongjun.

* cited by examiner

EXTREME DURABILITY COMPOSITE DIAMOND FILM

This application claims the benefit of Provisional Application No. 62/166,338, filed on May 27, 2015. The entire contents of the Provisional Application are incorporated herein by reference for all purposes.

FIELD OF THE INVENTION

This invention relates to a composition of matter for a smooth, non-conductive (or conductive) composite diamond film deposited upon a non-diamond substrate and possessing extraordinary durability to shear stress/delamination and chemical resistance exceeding that of prior art polycrystalline diamond films. The many existing applications of diamond films can benefit from the improved durability and reliability of the inventive diamond film.

BACKGROUND

The synthesis of diamond materials is inherently expensive, and the nature of the typical deposition technologies involved make it difficult to coat a given surface with diamond in a manner that is economically attractive while also maintaining high functionality. Also, there are many examples in which functionality can be achieved but the durability of the coating is so poor as to again undermine the commercial viability of the technology:

Wear resistant coatings—The diamond must survive high shear stresses without delaminating from the substrate, yet be both smooth (low friction) and hard (wear resistant) across a broad spectrum of harsh conditions (face pressures, media containing abrasive substances/chemicals/particles, etc.)

Electrochemical electrodes—In order to reduce cost and to improve compatibility with other materials, diamond coatings must typically be integrated with conducting metal substrates with much higher thermal expansion coefficients as compared to diamond, and also with characteristics generally unfavorable for the nucleation and adhesion of diamond to the substrates (i.e. not good carbide-forming materials). Also the films must be pin-hole free to avoid electrochemical reactions to occur at the diamond/substrate interface which also can lead to delamination of the film from the substrate. The diamond must be doped with boron or other dopant to make it conductive, and the surface of the diamond that will drive most of the electrochemical reactions, (for which diamond is attractive) must consist of a large $sp^3$-bonded fraction. The surface of the diamond must not consist of large amounts of $sp^2$-bonded (graphitically bonded) carbon that can reduce the over-potential for oxygen evolution in water-based reactions, or reduce the chemical inertness of the film that is important in all electrochemical applications, including those that occur in aqueous environments.

Biomedical Devices—Commonly used biomedical materials such as Ti-alloys, high-density graphite, and ferrous alloys present unique challenges for the initial nucleation of diamond in order to produce films that will survive for long periods of time, in the body, without the need for replacement. Again, the chemistry that optimizes the properties of the interface between the diamond and the substrate are usually not those that optimize the surface of the diamond for the applications. For hip/knee replacements the diamond must be bio-inert, bio-stable, and resistant to wear and fouling, as well as being smooth and free from surface features that would lead to excessive wear of the counterface material (such as, Ultra High Molecular Weight PolyEthylene—UHMWPE or Cobalt-Chrome alloys). Heart valves consisting of pyrolytic carbon coated with diamond also must be optimized in a similar manner, with the use of pre-processing and initial growth chemistries that promote enhanced chemical and mechanical adhesion to the substrate, but are then changed during the deposition process so that the terminal surface of the diamond coating is optimized to be anti-thrombogenic.

Biosensors—again the adhesion to the substrate is important, but the terminal surface must promote the attachment of targeted biomolecules typically used to impart bioselectivity to the surface. An example is the covalent attachment of antibodies specific to *E coli*. H157 for the detection of this weaponized pathogen.

MEMS devices & Diamond-based micro-machines—For diamond thin films to be optimized for these applications, the films must be deposited on substrates than can be etched away to fabricate suspended structures of diamond (micro-cantilevers, comb-structures, etc.), yet the overall film must have a net zero residual film stress. These films may also need to be post-polished to deliver near atomic smoothness so that subsequence layers of other thin film materials can be deposited onto them. Extreme adhesion is required between the diamond layer and the substrate to prevent delamination during polishing, other processing and during operation of such MEMS devices.

A common element for the development of thin diamond coatings that are technically and commercially successful is the need to develop a series of process steps that optimize two critical attributes: the diamond/substrate interface—achieved through a combination of choice of substrate, pre-processing of the substrate (e.g. by roughening the surface and "seeding" it with diamond particles of a particular size), and a choice of initial diamond growth chemistry to maximize the chemical and mechanical bonding of the diamond to the substrate and also the uniformity of the growth across the substrate, which can be relatively large in dimension in comparison to the thickness of the film.

The terminal diamond surface achieved by a combination of growth chemistry (different from that of the chemistry used during the initial nucleation and growth) and post-processing of the film (i.e. lapping, polishing, chemical functionalization to terminate the surface with chemical species to further optimize its functionality for different applications).

Central to the innovation described here is the concept of functional, commercially viable synthetic diamond films that optimize both the diamond/substrate interface and the terminal diamond surface to enhance their attractiveness for actual applications of interest. The use of chemical vapor deposition (CVD) tools such as hot-filament CVD, microwave plasma CVD, and other CVD tools, allows for the chemistry of the diamond film being deposited to be adjusted during the growth so as to overcome the issues described above. Pre- and post-processing must also be used in order to accomplish the objective.

Diamond is well known to be a hard material by those unskilled in the art. For those skilled in the art it is generally well known that the properties of diamond thin films grown using conventional chemical vapor deposition technologies can be adjusted and optimized for different applications. Choices of deposition chemistries can, for instance, dramatically change the optical transparency or thermal conductivity of the material. In most cases engineering of the film for a particular property, results in the diminishment of other important film properties. High thermal conductivity requires growth chemistries that yield larger diamond grains, which have an overall negative impact on the differential stress of the film and the cost as well, i.e. slower deposition rates. Fine grain diamond materials that are well suited to achieve superior film adhesion and lower film stress yield less favorable thermal conductivities and are also not as optically transparent. Films grown to be highly thermally conductive are less smooth and are less desirable for applications that require low friction and high wear resistance. Therefore, there is a need to develop a novel diamond film which can simultaneously deliver several of the required properties without an increase in deposition cost.

DESCRIPTION OF THE RELATED ART

Diamond films have been deposited previously using many techniques and have been well characterized in terms of $sp^2$ (graphitic carbon) versus $sp^3$ (diamond) carbon content, grain size distribution, roughness, friction coefficient, Young's modulus, durability under extreme stress and many other key characteristics. For example, U.S. Pat. No. 7,556,982 (Carlisle) and U.S. Pat. No. 6,592,839 (Gruen) describe ultrananocrystalline diamond (UNCD®) films comprised of pure $sp^3$ diamond grains of less than 10 nm average grain size independent of thickness. When correctly deposited, i.e. "phase pure", such UNCD films are typically comprised of less than 8% overall $sp^2$ carbon content, as characterized by NEXAFS (Near Edge X-Ray Absorption Fine Structure Spectroscopy), principally due to the $sp^2$ bonding between grains. Typical Young's moduli for such UNCD films vary between 550 and 900 GPa.

More traditional microcrystalline diamond (MCD) films, as for example in U.S. Pat. No. 4,766,040 (Hillert), typically exhibit grain sizes from 100 nm up to several microns in average grain size which increases with increasing film thickness during deposition. Such MCD films, when correctly deposited, i.e. "phase pure", usually exhibit less than 1% $sp^2$ carbon content because of the larger average grain size and less grain boundary of these films as compared to UNCD. Chemical and electrochemical properties dependent upon $sp^2$ carbon content, such as oxidation resistance and surface catalysis, will therefore tend to differ when comparing the properties of UNCD and MCD. Typical Young's moduli for MCD films approach those of single crystal diamond and are in the range of 900-1200 GPa.

Other bilayer or multilayer composite diamond films are known in the art. For example, U.S. Pat. No. 5,955,155 to Yamato et al., describes a multi-layer diamond film of at least 20 µm in thickness with a combination of MCD layers of grain size 3-7 µm, U.S. Pat. No. 7,384,693 to Ravi, describes a two layer diamond-like carbon composite film with pores and nitrogen doping to reduce film stress. U.S. Pat. No. 7,563,346 to Chen, also describes a multi-layer composite diamond-like carbon film using an interfacial layer of amorphous carbon to improve bond strength to the underlying substrate. Finally, U.S. Pat. No. 8,101,273 to Jacquet et al., describes a multilayer nanostructure separated by many intervening layers of diamond-like carbon. However, the last patent uses many layers of diamond in order to act as barrier layers between the nanostructures.

SUMMARY OF THE INVENTION

The present invention seeks to simultaneously improve the delamination resistance of diamond films deposited upon other substrates, to reduce the cost of durable diamond films, to decrease the relative roughness of relatively thick diamond films and to provide thinner composite layers of similar or improved reliability over thicker single layer films. At least a bilayer approach is proposed to deliver this improvement. Ultrananocrystalline Diamond (UNCD) films are particularly favored as an underlying layer because of it high deposition rates, small grain sizes (high re-nucleation rates), their extremely low roughness which is not dependent upon thickness, their extreme chemical compatibility with other diamond films, and their somewhat lower brittleness due to their somewhat lower Young's modulus and larger internal grain surface areas. UNCD is also much more easily polished even to sub-nm average roughness because of the somewhat lower Young's modulus of UNCD films and the larger proportion of $sp^2$ carbon present in the film. Adjustment of the thickness of the underlying UNCD layer can be effected to optimize the stress relief and the other desired properties of the composite stack (such as radiation resistance and overall delamination resistance). An overlying layer of MCD is a superior choice due to its extreme chemical and biological inertness and its unsurpassed hardness. Given that the underlying layer can constitute the bulk of the thickness of the composite stack, the overlying layer can be much thinner and yet maintain a relatively high overall shear resistance of the composite stack. A thin MCD layer surface overlying a thick underlying UNCD layer then delivers a robust combination of properties such as hardness, durability and chemical inertness appropriate for many different challenging applications in a composite diamond film that significantly outperforms the corresponding properties of a single (non-composite) layer.

DETAILED DESCRIPTION

Figure 2A:
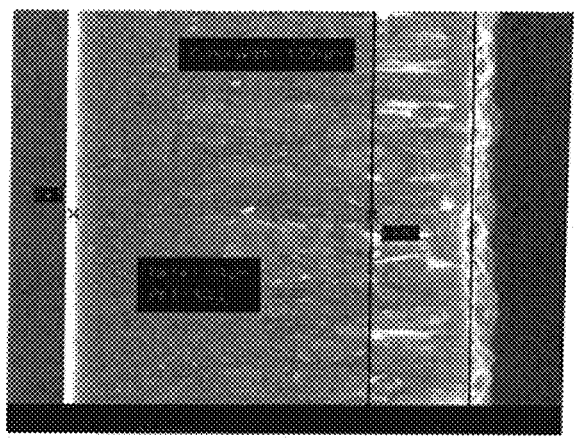
FIGS. 2a and 2b are cross-sectional and top-view SEM micrographs respectively of an example of an embodiment of the invention with a 5.9 µm underlying (structural) layer of UNCD and an overlying (functional) 2.0 µm layer of MCD.

CVD (Chemical Vapor Deposition) and other diamond deposition techniques including PECVD (Plasma Enhanced Chemical Vapor Deposition) are well known in the art and these prior art techniques can be used to deposit diamond(s) with various properties and thicknesses. Prior art methods of depositions were used to deposit a first underlying (or "structural") UNCD layer of approximately 6 μm in thickness as shown in FIG. 2a. As in the prior art, a $CH_4/H_2$ mixture is used for the deposition with a methane ($CH_4$) to hydrogen ($H_2$) ratio of 1-10% and an approximate pressure in the range of 1-10 torr. UNCD deposition rates of between 0.1-1.0 μm per hour were achieved depending upon the substrate deposition temperature in the range from 400-900° C. This "structural" UNCD deposition was followed by an overlying "functional" MCD layer deposition of approximately 2 μm in thickness. The MCD layer deposition is typically performed with a $CH_4/H_2$ mixture at a $CH_4$ to $H_2$ ratio of 0.1-1% at a pressure in the range of 10-100 torr. MCD deposition rates for a substrate deposition temperature range from 400-900° C. can be as much as ten times slower than those of UNCD. The cross-sectional Scanning Electron Micrograph (SEM) of the inventive composite film shown in FIG. 2a clearly shows the underlying (structural) UNCD layer deposited on a smooth silicon wafer substrate and the overlying (functional) MCD layer deposited on top of the UNCD layer.

Figure 1:
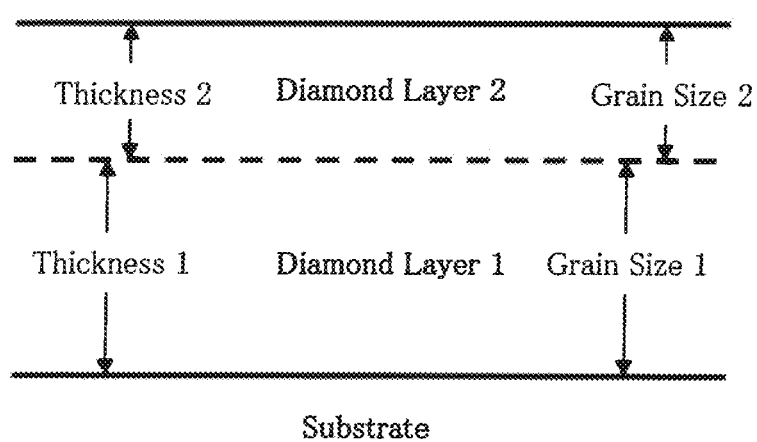
FIG. 1 is a schematic drawing of embodiment of the invention with a thick underlying polycrystalline diamond layer with a small grain size and an overlying polycrystalline diamond layer with a larger grain size.

FIG. 1 is a schematic representation of the inventive composite diamond film wherein the underlying diamond layer exhibits a significantly different grain size than the overlying diamond layer. In an embodiment, the first underlying diamond layer is comprised of UNCD and the second overlying diamond layer is comprised of MCD. However, the grain size can be either gradually increased, or significantly increased (in a single large step) from the underlying diamond layer to the overlaying diamond layer. Typical thicknesses of diamond layer 1 and diamond layer 2 are in the range of 2-10 μm and 1-5 μm respectively. Typical grain sizes of diamond layer 1 and diamond layer 2 are less than 10 nm and greater than 100 nm respectively.

Figure 2B:
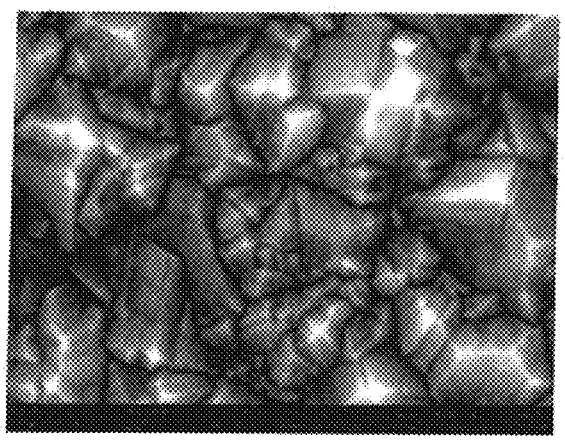

FIG. 2b a top view SEM of the inventive composite film with MCD grain formation clearly evident with a variable grain size in the approximate range of 0.2-2 μm is shown.

An underlying 5.9 μm thick UNCD film with an average grain size of less than 10 nm is covered by a MCD film of approximately 2.0 μm in thickness.

The composite diamond film comprising the underlying UNCD layer and the overlying MCD layer would exhibit an average roughness in the range of 30-100 nm if deposited on a smooth substrate, such as a silicon wafer used for integrated circuits with typical average roughness in the range of 0.2-0.3 nm. A thicker film of MCD would increase the grain size and the roughness of the composite film and significantly increase the deposition time and cost. However, this is unnecessary because of the large thickness of underlying structural UNCD.

Figure 3:
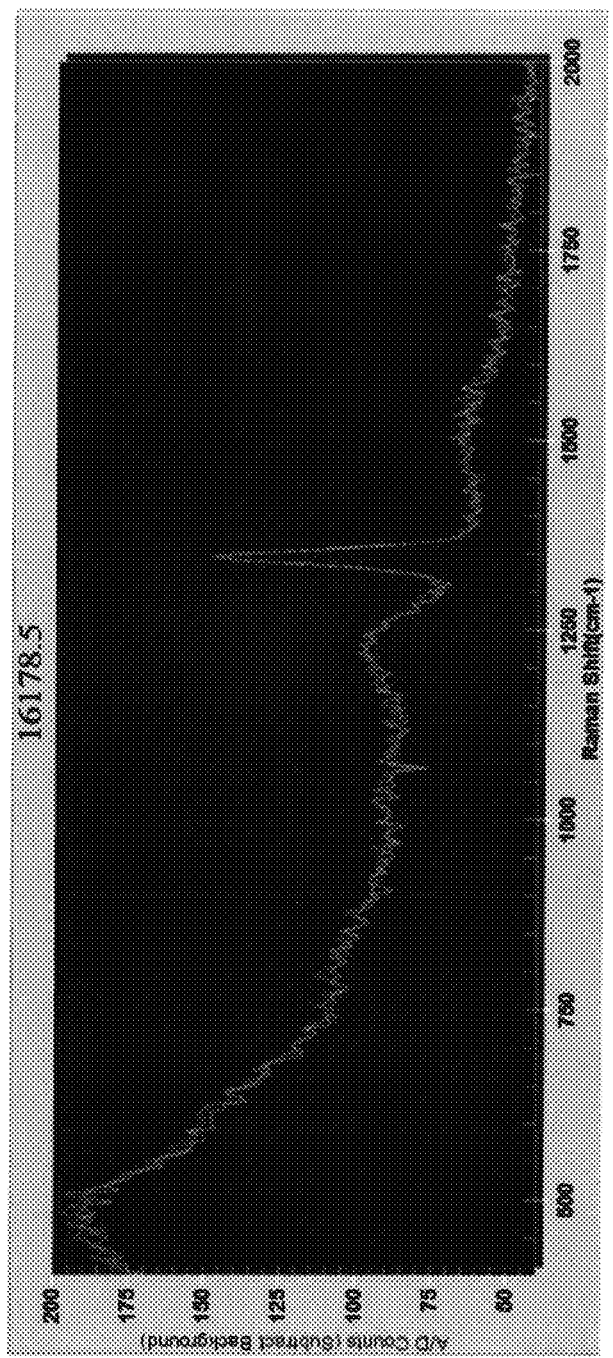
FIG. 3 is A 532 nm Nd-YAG laser Raman top-view spectrum of the inventive composite diamond film.

In FIG. 3 a laser Raman spectrum of the surface of the composite diamond film (total of about 7 μm in thickness) with the spectrum taken with Raman scattering from the MCD surface is shown. A 532 nm Nd-YAG laser excitation wavelength is used to produce the spectrum shown. The spectrum clearly demonstrates the presence of the peak for sp3 hybrid band at 1332 $cm^{-1}$ typical of large-grained diamond films and a much reduced (as compared to UNCD) broad "G" peak at 1170-1250 $cm^{-1}$. This spectrum is characteristic of MCD films.

The characteristic long range order of $sp^3$ carbon in large grained diamond films is evident at 1332 $cm^{-1}$, despite the presence of more than 5 μm of UNCD beneath the MCD surface layer. This is due to the sensitivity of Raman scattering from surface layers of materials exposed to the 532 nm Nd-YAG laser illumination.

Figure 4:
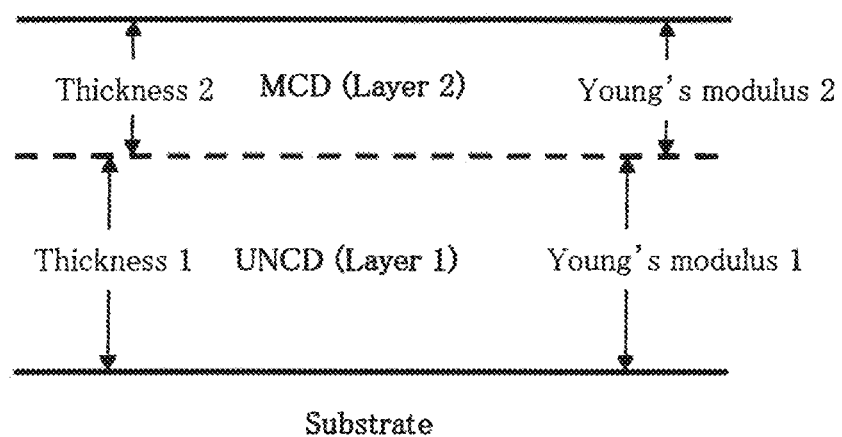
FIG. 4 is a schematic drawing of the inventive composite diamond film showing the respective Young's moduli of the two component diamond layers with the underlying UNCD layer with a lower Young's modulus than the overlying MCD layer.

In FIG. 4 a schematic image of the inventive film characterizing the differential Young's modulus between the underlying UNCD and MCD layers is presented. The Young's modulus of the underlying UNCD layer is less than 900 GPa and the Young's modulus of the overlying MCD layer is Greater than 900 GPa.

Typical UNCD Young's modulus can be in the range of 550-900 GPa and can be adjusted by adjusting the deposition parameters. The Young's modulus of MCD is closer to that of single crystal diamond (1220 GPa) and is typically in the range of 900-1200 GPa. The combination of the extreme chemical affinity between an MCD diamond layer grown on an existing UNCD layer with the nearly identical linear thermal expansion coefficient between the two layers, i.e. ~1 ppm, provides nearly ideal adhesion between the two diamond layers.

It is well known to those skilled in the art of thin films that the use of strain-relieving layers can dramatically impact the quality of addition thin films grown on top of such layers. This is particularly true for the integration of epitaxial layers with substrates in which there is a significant lattice mismatch between the overlayer and substrate. So-called "buffer" layers are used to distribute the stress within the heterostructure to prevent delamination and improve the overall material properties of the overlayer. An underlying diamond layer of UNCD therefore serves the purpose of a "buffer" layer to distribute the deposition stress and stress generated in the layer during usage and thereby improve the overall delamination resistance of the composite film under shear stress.

Without wishing to be bound by a particular theory, it is hypothesized that the combination of the strong adhesion between the two diamond layers and the "cushioning" effect of the somewhat "softer" underlying "buffering" UNCD layer provides at least some of the observed improvement in delamination resistance under shear stress. Additionally, the discontinuity in grain size between the two diamond layers may contribute to a reduction in defect propagation probabilities. Non-withstanding the complex potential mechanisms that may contribute to the overall improvement in durability to shear stress, the experimental data indicates an improvement in lifetime under typical shear stress conditions of at least 5-10 times over non-composite films with homogenous grain size of the same or similar thickness. MCD films with comparable thickness would be much more expensive due to their 3-10 times longer deposition times. The increase in reliability for a given thickness of the inventive composite film therefore offers the prospects of using thinner and less expensive diamond layers for a given application and desired reliability.

Figure 5:
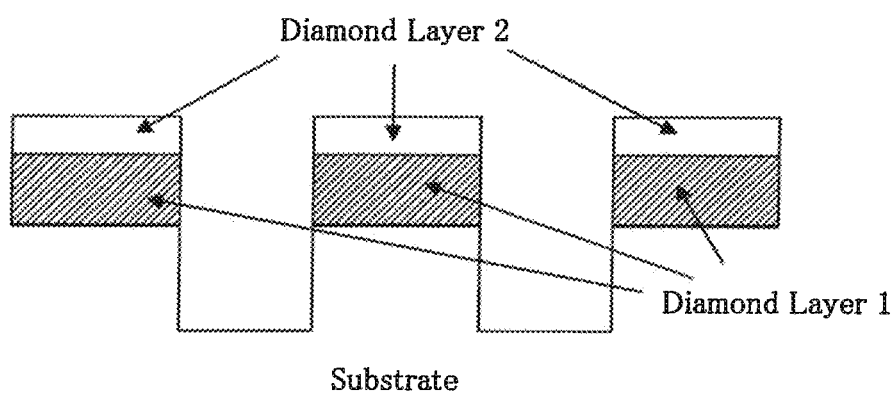
FIG. 5 is a schematic drawing of the inventive composite diamond film deposited on a substrate and subsequently patterned.
Figure 6:
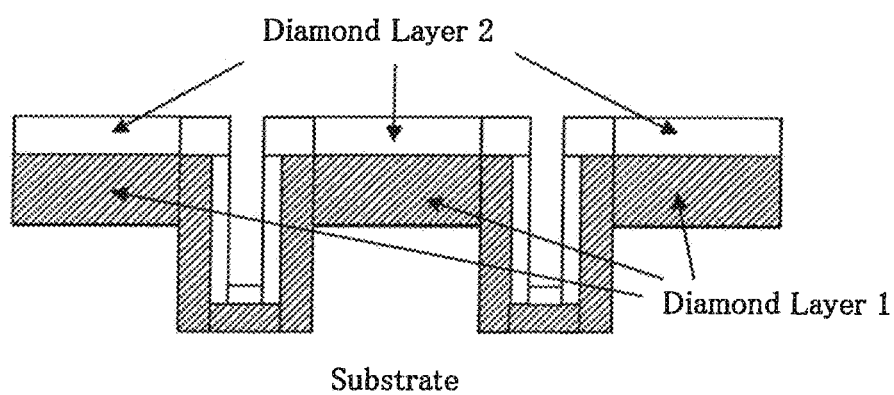
FIG. 6 is a schematic drawing of the inventive composite diamond film deposited conformally on a previously patterned substrate.

FIGS. 5 and 6 show schematic representations of the inventive composite diamond film deposited on a substrate and then patterned together with the substrate (FIG. 5) and deposited on a patterned substrate (FIG. 6). Such processing utilizes prior art microfabrication techniques for diamond (typically an oxygen plasma etch) for typical substrate materials such as silicon and metals. Such structures are useful for integrated circuit applications and for MEMS (Micro-Electronic Mechanical System) devices. The utilization of the inventive composite diamond film is useful for these applications in that it can reduce the relative cost of the diamond deposition for a given reliability or performance goal and can extend the mechanical wear lifetime of MEMS devices especially where the most wear prone surfaces would optimally be coated with the inventive film.

Typical thicknesses for these applications would tend to be lower than for other applications, e.g. a 1-3 μm thick UNCD film and a 0.5-1 μm thick overlying MCD film but maintaining a ratio of thickness between the underlying (UNCD) diamond film and the overlying (MCD) diamond film of at least 2:1 and preferable as high as 5:1 is still recommended.

Figure 7:
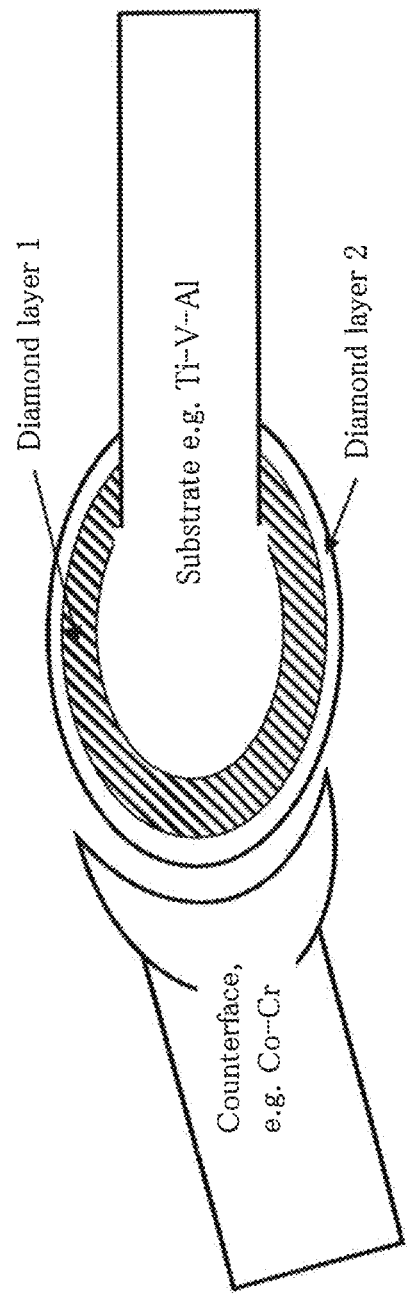
FIG. 7 is a schematic drawing of a biomedical joint implant coated with the inventive composite diamond film.

FIG. 7 shows a schematic representation of the inventive composite diamond film applied to typical biomedical application (joint implant) that would particularly benefit from the durability and relative smoothness of the resultant diamond film as well as its unsurpassed bioinertness. In particular, FIG. 7 depicts a schematic drawing of the inventive composite diamond film coating a high durability biomedical joint implant material, e.g. a titanium-vanadium-aluminum alloy, and also showing a typical counterface material, e.g. a cobalt-chrome alloy.

Common biomedical metal alloys with excellent biocompatibility, such as Ti—V4-Al6 (4% Vanadium and 6% Aluminum) are typically not utilized for high shear stress or high wear applications (such as joint surfaces) because of its relatively low Young's modulus (110 GPa). Coating such an alloy with smooth diamond would dramatically enhance its reliability for such demanding applications. Fortunately, titanium forms a stable carbide upon contact with diamond at its deposition temperature forming a strong bond at the interface between a UNCD (or other diamond) layer and the metal alloy. Cobalt-Chrome alloys, such as the 27-30% Chromium, 5-7% Mo described in ASTM-F75 for implants is an excellent counter-face material for a smooth diamond material of the inventive composite diamond film.

Other applications such as prior art abrasive, cutting, and protective coating applications are also appropriate for the inventive composite diamond film where the reliability of prior art diamond films on metal substrates present a concern. The up to 10-fold or more increase in shear stress failure lifetime of the inventive material presents unprecedented improvements in cost and performance for these high volume applications.

Alternative embodiments of the inventive composite diamond film include the use of Nanocrystalline diamond as the underlying layer and MCD as the overlying layer or UNCD as the underlying layer and MCD as the overlying layer. As in prior art diamond films, either or both layers may be doped with either N (e.g. nitrogen) or P-type (e.g. boron) dopants. The use of only two such layers may be sufficient for most applications. However, where extreme reliability or thicker diamond layers are appropriate (e.g. for fusion or fission reactor surfaces suffering from extreme radiation or temperature stress), an additional set of underlying and overlying layers may be appropriate. This could involve a third diamond layer similar in properties (but not necessarily thickness) as the first diamond layer, (e.g. UNCD) and a fourth diamond layer similar in properties (e.g. MCD) to the second overlying layer.

Finally, given the lower as-deposited roughness of UNCD and its somewhat lower Young's modulus and smaller grain size, it is more economical (usually much shorter time) to polish such diamond films using chemical mechanical polishing or even traditional mechanical diamond polishing methods. Such polishing has been achieved at Advanced Diamond Technologies and average roughness values of less than 1 nm have been readily obtained for such UNCD films. Deposition of a second diamond film on top of a polished UNCD film would begin from a much smoother surface and as a result, a thin second diamond layer (e.g. MCD) would deliver a smoother resulting overall composite film. Therefore the combination of the smoother and thicker underlying UNCD film plus the relative ease with which it can be polished, and the relative thinness of the overlying MCD layer delivers a much smoother and more economical composite diamond layer than would be possible with a single layer of MCD.

The invention claimed is:

1. A composite diamond film disposed on a substrate comprising: at least a first underlying diamond layer comprising ultrananocrystalline diamond having a first average thickness and an average $sp^2$ carbon content said first underlying diamond layer being deposited directly onto at least one side of the substrate and a second outermost diamond layer having a second average thickness and an average $sp^2$ carbon content said second outermost diamond layer being deposited directly onto the first underlying diamond layer, wherein the thickness of the first underlying diamond layer is at least 2 times thicker than the second outermost diamond layer and $sp^2$ carbon content of the first underlying diamond layer is at least five times greater than the $sp^2$ carbon content of the second outermost diamond layer.

2. The composite diamond film of claim 1, wherein the second outermost layer is a polycrystalline diamond layer.

3. The composite diamond film of claim 1, wherein the first underlying diamond layer has an average grain size of less than 10 nm and the second outermost diamond layer has an average grain size of greater than 50 nm.

4. The composite diamond film of claim 3, wherein the second outermost diamond layer has an average grain size of greater than 100 nm.

5. The composite diamond film of claim 1, wherein the grain size increases from the first underlying diamond layer to the second outermost diamond layer at an interface in between.

6. The composite diamond film of claim 1, wherein the average thickness of the first underlying diamond layer is between 1 micron and 20 microns.

7. The composite diamond film of claim 6, wherein the average thickness of the first underlying diamond layer is between 2 microns and 10 microns.

8. The composite diamond film of claim 1, wherein the average thickness of the second outermost diamond layer is between 1 micron and 5 microns.

9. The composite diamond film of claim 1, wherein the first underlying diamond layer has an average Young's modulus of less than 900 GPa.

10. The composite diamond film of claim 1, wherein the second outermost diamond layer has an average Young's modulus of greater than 900 GPa.

11. The composite diamond film of claim 1, wherein the first underlying diamond layer has an average Young's modulus of less than 800 GPa.

12. The composite diamond film of claim 1, wherein the second outermost diamond layer has an average Young's modulus of greater than 1000 GPa.

13. The composite diamond film of claim 1, wherein the average thickness of the first underlying diamond layer is at least five times thicker than the average thickness of the second outermost diamond layer.

14. The composite diamond film of claim 1, where a diamond orientation of the first underlying diamond layer and the second outermost diamond layer is same.

15. The composite diamond film of claim 1, where a diamond orientation of the first underlying diamond layer and the second outermost diamond layer is different.

16. The composite diamond film of claim 1, wherein the substrate is a non-diamond carbide forming material.

17. The composite diamond film of claim 16, wherein the substrate comprises one or more of niobium, tantalum, tungsten, titanium, molybdenum, zirconium, silicon, silicon carbide, tungsten carbide, pyrolytic carbon or graphite and alloys and mixtures thereof.

18. The composite diamond film of claim 1, wherein both the first underlying diamond layer and the second outermost diamond layer are electrically insulating.

19. The composite diamond film of claim 1, wherein both the first underlying diamond layer and the second outermost diamond layer are electrically conductive.

20. The composite diamond film of claim 1, wherein the first underlying diamond layer is electrically insulating and the second outermost diamond layer is electrically conductive.

21. The composite diamond film of claim 1, wherein the first underlying diamond layer is electrically conductive and the second outermost diamond layer is electrically insulating.

22. The composite diamond film of claim 1, wherein the second outermost diamond layer comprises microcrystalline diamond.

23. The composite diamond film of claim 1, wherein both the first underlying diamond layer and the second outermost diamond layer are monolithic diamond layers.

24. The composite diamond film of claim 1, wherein an average surface roughness of the second outermost diamond layer is less than 100 nm.

25. The composite diamond film of claim 1, wherein the first underlying diamond layer has a deposited average roughness of less than 20 nm.

26. The composite diamond film of claim 1, wherein the first underlying diamond layer has an average roughness of less than 1 nm.

27. The composite diamond film of claim 1, wherein the first underlying diamond layer is coated on the substrate in the same deposition run as the second-outermost diamond layer coated on the first underlying diamond layer, without breaking reactor vacuum.

28. The composite diamond film of claim 1, wherein the first underlying diamond layer is coated on the substrate in the first deposition run followed by the second outermost diamond layer coated on the first underlying diamond layer in the second deposition run separated from the first deposition run.

29. A composite diamond film, disposed on a substrate comprising: at least a first underlying diamond layer comprising ultrananocrystalline diamond having a first average thickness and an average $sp^2$ carbon content, said first underlying diamond layer being deposited directly onto at least one side of the substrate and a second diamond layer having a second average thickness and an average $sp^2$ carbon content and optionally comprising a third diamond layer deposited to the second layer and having a third average thickness and a third average $sp^2$ carbon content and a fourth diamond layer deposited to the third diamond layer having a fourth average thickness and a fourth average $sp^2$ carbon content, said second diamond layer being deposited directly onto the first underlying diamond layer, wherein the thickness of the first underlying diamond layer is at least 2 times thicker than the second diamond layer and $sp^2$ carbon content of the first underlying diamond layer is at least five times greater than the $sp^2$ carbon content of the second diamond layer, wherein the third $sp^2$ carbon content is approximately equal to the $sp^2$ carbon content of the first underlying diamond layer and the fourth $sp^2$ carbon content is approximately equal to the $sp^2$ carbon content of the second diamond layer.

30. The composite diamond film of claim 29, wherein the third diamond layer comprises ultrananocrystalline diamond and the fourth diamond layer comprises microcrystalline diamond.

31. The composite diamond film of claim 29, wherein the third average thickness of the third diamond layer is less than half of the first average thickness of the first underlying diamond layer.

32. The composite diamond film of claim 1, wherein both a cohesive failure strength and an adhesive failure strength of the composite film is greater than a cohesive failure strength and an adhesive failure strength of a monolayer of diamond of approximately the same thickness as a cumulative thickness of both layers of the composite film.

33. The composite diamond film of claim 1, wherein the composite diamond film is disposed on a material selected from the group consisting of a cutting tool, an abrasive surface, a thermally conductive instrument, a biomedical device or a biomedical implant.

\* \* \* \* \*